United States Patent [19]

Gordon

[11] Patent Number: 4,558,449
[45] Date of Patent: Dec. 10, 1985

[54] SEMICONDUCTOR LASER WITH COUPLED LOSS MODULATOR FOR OPTICAL TELECOMMUNICATIONS

[75] Inventor: Eugene I. Gordon, Convent Station, N.J.

[73] Assignee: AT&T Bell Laboratories, Murray Hill, N.J.

[21] Appl. No.: 511,847

[22] Filed: Jul. 8, 1983

[51] Int. Cl.[4] .............................................. H01S 3/19
[52] U.S. Cl. ...................................... 372/44; 372/26; 372/50; 372/92
[58] Field of Search ...................... 372/44, 50, 26, 92

[56] References Cited

U.S. PATENT DOCUMENTS

| | | | |
|---|---|---|---|
| 3,748,597 | 7/1973 | Reinhart | 333/7.51 |
| 3,897,135 | 7/1975 | Dyott | 372/49 |
| 4,284,963 | 8/1981 | Allen et al. | 372/50 |

FOREIGN PATENT DOCUMENTS

| | | | |
|---|---|---|---|
| 0014389 | 2/1977 | Japan | 372/29 |
| 0024460 | 2/1980 | Japan | 372/29 |

OTHER PUBLICATIONS

Dyment et al., "Suppression of Semiconductor Laser Pulsations using Optical Feedback from a Fiber", *J. Appl. Phys.* 51(10), Oct. 1980, pp. 5252–5256.
Coldren et al., "Monolithic Two-Section GaInAsP-/InP Active-Optical-Resonator Devices formed by Reactive Ion Etching", *APL* 38(5) Mar. 1, 1981, pp. 315–317.
R. A. Logan et al., "InGaAsP/InP (1.3 $\mu$m) Buried-Crescent Lasers with Separate Optical Confinement," *Electronics Letters*, vol. 18, No. 20, Sep. 30, 1982, pp. 895–896.
W. T. Tsang et al., "High-Speed Direct Single-Frequency Modulation with Large Tuning Rate and Frequency Excursion in Cleaved-Coupled-Cavity Semiconductor Lasers", *Applied Physics Letters*, vol. 42, No. 8, Apr. 15, 1983, pp. 650–652.
D. Welford et al., "Output Power and Temperature Dependence of the Linewidth of Single Frequency CW (GaAl) as Diode Lasers", *Applied Physics Letters*, vol. 40, No. 10, May 15, 1982, pp. 865–867.

*Primary Examiner*—James W. Davie
*Attorney, Agent, or Firm*—David I. Caplan

[57] ABSTRACT

A semiconductor heterojunction optical loss modulator section (30), having an anti-reflection coating (52) on its optical output beam facet (32), is located with an opposite facet (31) optically coupled to, and closely spaced from, a semiconductor heterojunction laser section (20) having substantially the same cross-section structure as the loss modulator section (30). The laser section is operated CW in a single mode. In this way, the output beam (50) emanating from the laser section (20) and passing through the anti-reflection coating (52) can be coupled into an optical fiber (60) for transmission purposes. This output beam (50) is substantially single frequency and is intensity modulated, in a signal-pattern independent fashion, in accordance with an electrical signal applied to the loss modulator section (30).

25 Claims, 2 Drawing Figures

SEMICONDUCTOR LASER WITH COUPLED LOSS MODULATOR FOR OPTICAL TELECOMMUNICATIONS

FIELD OF THE INVENTION

This invention relates generally to optical telecommunication systems including semiconductor laser sources and, more particularly, to such laser sources including output power modulation means.

BACKGROUND OF THE INVENTION

In optical telecommunication systems, modulated optical wave energy typically is transmitted from an optical source to a remote optical receiver through the medium of an optical fiber. The fiber supplies desirable waveguiding of the optical energy along a desired transmission path from source to receiver. A typical and useful source of the transmitted optical energy is a laser, such as a semiconductor diode laser having a double heterojunction structure ("double heterostructure"). For signaling purposes—i.e., in order to transmit information from source to receiver—the optical wave is modulated either in power or in frequency as a function of time. Either analog or digital modulation is used, depending upon a variety of technological and economic considerations. A typical and useful form of modulation is binary digital power modulation or pulse code modulation, that is, modulation where the optical power during each allotted time slot (or window) is made to be HIGH or LOW (ON or OFF) representing, respectively, a binary digital 1 or 0. Thus, each bit of the resulting data stream is transmitted as the presence vs. absence of optical power during each allotted time slot.

Known optical fibers, which have the lowest loss——and hence which can transmit digital data over relatively long distances (of the order of 100 km or more) without the need for signal regeneration ("repeaters'-")—have relatively high dispersion; that is, the fiber transmits different optical frequencies at different velocities. As a result of this dispersion, any relatively short pulse that contains more than one frequency (or more than one very narrow frequency band) is distorted during propagation, and hence the ability to detect the pulse is compromised, whereby an error at the receiver in the detection of the pulses tends to occur. Similarly, because of dispersion, any pulse containing a single substantially pure frequency (or very narrow band frequency spectrum) that is even only slightly different from the frequency of preceding pulses will arrive at the receiver during a time slot which is slightly different from the slot that has been assigned for that pulse, such assigning of the time slot having been based upon the supposition of precisely equal frequency for all pulses; thereby a similar error of detection occurs at the receiver. In either event, dispersion thus produces errors in the detection of the pulses.

A typical and useful form of laser source, therefore, is a modulated semiconductor heterojunction diode laser operating in a single electromagnetic mode which unambiguously produces a single substantially pure frequency output. Such single-mode operation is desirable to avoid undesirable confusion of the information carried by the wave, such confusion otherwise being caused by the above-mentioned dispersion, i.e., different frequencies would travel through the fiber at different velocities.

In U.S. Pat. No. 3,748,597, filed by H. K. Reinhart on July 24, 1973 entitled "Optical Modulator," a technique for modulating a semiconductor heterojunction diode laser section is described in which one end facet of the laser is spaced from an end facet of a semiconductor diode modulator section by a spacing layer composed of a partially transmissive and electrically insulating material. However, because of the disparate heterojunction structures of the cross sections of the laser and modulator sections and because of the thickness of the spacing layer, undesirable optical loss occurs in the transfer of optical radiation from one section to the other due to poor optical coupling between these sections.

Recently, W. Tsang et al, in a paper entitled "High-speed Direct Single-frequency Modulation with Large Tuning Rate and Frequency Excursion in Cleaved-coupled-cavity Semiconductor Lasers," published in *Applied Physics Letters*, Vol. 42, pp. 650–652 (April 1983), and in a pending patent application by W. Tsang, Ser. No. 482,964, filed Apr. 8, 1983, entitled "Multicavity Optical Device," have described a cleaved-coupled cavity ($C^3$) laser source typically of optical wavelength about 1.5 micron. This source was formed by a pair of spaced, optically coupled, mutually electrically isolated, similar heterojunction diodes. The spaced relationship between the diodes was obtained by cleaving a monolithic diode structure located on an electroplated or evaporated gold pad to form a pair of physically separate diodes, followed by using the gold pad as a hinge to adjust the distance of separation between the diodes. Such a laser source has an output optical beam which can be adjusted in frequency by suitable adjustment of electrical currents delivered to the diodes.

Typically, for data transmission purposes, to one of the diodes is applied a steady (dc) current bias and to the other of the diodes is applied a sequence of mutually equal voltage pulses superimposed upon another steady current bias, this sequence corresponding to the sequence of digital 1's and 0's desired to be transmitted. Such a laser source has the advantage of single longitudinal mode performance. That is to say, once laser oscillation therein commences, so that a frequency of laser oscillation in a longitudinal mode is established in response to a voltage pulse applied to one of the diodes, the frequency (and hence wavelength of output beam) is pure and stable, i.e., is essentially a single frequency that remains the same for the entire duration of the pulse. Therefore, dispersion by the optical fiber located between source and receiver does not cause undesirable distortion of the optical pulses as they are being transmitted through the fiber. Accordingly, this laser may be used with a fiber optimized for minimum loss.

On the other hand, the mode and hence laser frequency of oscillation which is established may not be precisely the same for different pulses unless special precautions are taken. In other words, the mode of laser oscillation established in response to the current pulses may shift or jump after generation of a large number (say about $10^9$ or more) of such pulses. As a result, an undesirable event may occur when the output energy of such a laser source is transmitted to an optical detector through an optical fiber which suffers from dispersion: optical pulses corresponding to successive current pulses undesirably may not arrive at the receiver within their preassigned time slots or may even be reversed in times of arrival—that is, the optical pulse corresponding to a given current pulse may arrive at the receiver after (instead of before) the optical pulse corresponding to a subsequent current pulse. Such an undesirable event would constitute an error in signal transmission. Although the probability of such an error is quite small, typically of the order of less than one in a billion, it may be large enough to be of serious concern in binary digital data transmission systems where even such small error rates are not within desired system reliability specifications. Given the dispersion properties of present-day fibers, undesirably closer spacing between successive optical regenerators (or "repeaters") along the fibers to reconstitute the sequence of optical pulses would be required to prevent this kind of error unless special precautions are taken to avoid the shift in mode. Alternatively, the maximum useful pulse repetition rate would be undesirably limited: the higher the pulse repetition rate, the shorter the required pulse and hence the more easily slight changes in frequency would produce errors of arrival (during the wrong assigned time interval). Thus, although the laser described by Tsang et al is well suited for single mode fiber optical communication systems, unless precautions are taken, mode shifting may occur and cause errors in transmission.

Moreover, in the case of an internally modulated laser, as in the aforementioned Tsang et al paper, because of thermal effects produced by a succession of optical pulses, the amplitude (and hence power level) of a given pulse is signal pattern dependent, i.e., depends upon the actual signals (1's vs. 0's) during the preceding several time slots. Accordingly, the output power level of different pulses is variable, and in particular is undesirably degraded by a sequence of successive digital "1" signals. This degradation of power level necessitates an undesirable decrease in separation between regenerators along the transmission path, in order to accommodate the worst case signal sequence, i.e., a sequence of many successive 1's (typically as many as 15 successive 1's in present-day formats).

Accordingly, it would be desirable to have a laser source which, in response to a current pulse, operates in a single mode at a single frequency which is more reliably reproducible, i.e., which is more reliably of the same mode and of the same amplitude for successive current pulses than prior art.

SUMMARY OF THE INVENTION

In accordance with the invention, a single-mode modulated laser source comprises a semiconductor heterojunction laser portion for generating single-mode continuous wave (CW) optical radiation and a semiconductor heterojunction optical loss modulator portion for modulating the radiation generated by the laser portion. The heterojunctions of the modulator and the laser portions are mutually optically coupled and closely spaced from each other at the closest approach of a front end facet of the laser portion and a rear end facet of the modulator portion. By "closely spaced" is meant spaced by a distance of less than about a few wavelengths, i.e., typically equal to or less than about 4 microns, but at the same time spaced by a distance of more than about a tenth of the wavelength, i.e., typically more than about 0.1 or 0.2 micron—that is, spaced closely enough to avoid excessive diffraction loss of light while propagating between sections (i.e., good optical coupling), and spaced apart enough to assure sufficient optical reflectivity at the closely spaced facets and to avoid undesired electrical coupling between sections. The cross sections of the laser and the modulator portions are substantially identical as to heterojunction structure, in order to minimize optical coupling loss. An opposite, front end facet of the modulator portion is optically coupled to an anti-reflection layer.

During operation, CW laser oscillation is established in the laser portion. By virtue of the anti-reflection layer at the front end of the loss modulator portion, optical radiation from the laser portion which enters the loss modulator cannot be reflected back into the laser portion. Thus the CW operation of the laser portion is not disturbed by, but is independent of, modulation produced in the modulator portion. Accordingly, the loss modulator portion is said to be "external" to the laser portion. In this manner, the single-mode CW radiation generated by the laser portion is modulated by the loss modulator portion in accordance with an electrical signal applied to the modulator, and the thus modulated radiation passes through the anti-reflection layer into an optical utilization means, such as an optical fiber.

In a specific embodiment, the laser portion of the modulated laser source has two heterojunction diode sections. Thus, the laser source has first, second, and third mutually electrically isolated heterojunction diode sections (e.g., 10, 20, 30), all of substantially the same cross section structure. Each of the sections is separately provided with an electrode contact (e.g., 13, 23, 33) for providing voltage and current to the section. The first and second sections form the laser portion, and the third section forms the loss modulator portion of the laser source. The heterojunctions of the first and second sections (10, 20) are mutually optically coupled and closely spaced from each other at the closest approach of one end facet (e.g., 12 and 21), respectively, of each of the first and second sections, and the heterojunctions of the second and third sections (20 and 30) are mutually optically coupled and closely spaced from each other at the closest approach of another end facet (e.g., 22) of the second section (20), opposite the one facet (21) thereof, and one end facet (e.g., 31) of the third section (30). The first section (10) has another (left-hand) end facet (e.g., 11), located on the opposite end thereof from the one end facet (12) thereof. This other facet (11) of the first section (10) supports Fresnel reflection and optionally can be coated with an optical reflection coating (e.g., 51) for even greater reflectivity and hence efficiency; whereas the third section (30) has another (right-hand) end facet (e.g., 32), located opposite to the one end facet (31) thereof, which is coated with an optical anti-reflection coating (e.g., 52). An output optical beam (e.g., 50) emanates from the third section (30) through the anti-reflection coating (52) into an optical fiber (e.g., 60) directly optically coupled thereto. By "directly" optically coupled is meant optical coupling without any intervening reflection device. The first and second sections (10 and 20) form the laser portion, and these sections are constructed to operate in a single coherent continuous wave (CW) mode produced in response to predetermined steady dc currents applied to these sections. The third section (30) forms the modulator portion and is constructed to operate as an optical loss modulator—that is, its optical transmission loss can be modulated in response to a sequence of voltage pulses applied to it in accordance with the sequence of data desired to be transmitted. In this way, in response to the sequence of current pulses applied to the third section (30), the first and second sections (10 and 20) operate CW in a single mode while the output beam (50) is in the form of a sequence of optical pulses in accordance with the desired data.

All of the optical pulses in the output beam (50) are expected during operation to correspond to the same single mode. This single mode will be advantageously operated CW in response to the dc currents applied to the first and second sections (10 and 20), and will be supported and defined by Fresnel reflection at the left-hand facet (11) of the first section (10) (optically aided by the reflection coating, if any) together with Fresnel reflections at the one (right-hand) facet (12) thereof and at both facets (21 and 22) of the second section (20) and at the closely spaced facet (31) of the left-hand end of the third section (30). Because of the resulting single-mode CW operation in the first and second sections (10 and 11), and because the loss modulator section (30) has a transmission characteristic which is not influenced by preceding pulses, the output beam (50) will not suffer from mode shifting and will have pulse amplitudes which are independent of the signal pattern.

Illustratively, the first, second, and third sections of the laser are formed by cleaving a semiconductor heterojunction structure at two separate locations and then closely spacing both the resulting first section with respect to the resulting second section and the resulting second section with respect to the resulting third section. The third section provides the desired optical loss by application thereto of modulated reverse bias voltage, while the first and second sections have applied to them steady forward bias voltages suitable for coherent CW laser action.

The use of the third section as a loss modulator in this invention obviates the need for a modulator physically separate from the laser cavity and thus obviates problems of alignment, mechanical instability, and added undesirable optical losses in the modulator. In addition, the use of a semiconductor loss modulator avoids undesirably high electrical voltage and power loss in the modulator which would result from the use of an external modulator based upon the phenomenon of birefringence as is the case for most external modulators.

Alternatively, the first section is replaced by an optical fiber. The fiber produces a time delay for optical transit in the laser portion. Such a time delay is believed to be desirable for stabilizing the single-mode operation in the laser portion much in the same way as it is believed that, as explained in greater detail below, it is the time delay produced by optical transit in laser cavity regions of no optical gain that accounts for the single-mode stabilization effect reported by D. Welford and A. Mooradian, in a paper entitled "Output Power and Temperature Dependence of the Linewidth of Single Frequency CW (GaAl) As Diode Lasers," published in *Applied Physics Letters*, Vol. 40, pp. 865-867 (1982).

BRIEF DESCRIPTION OF THE DRAWING

This invention, together with its features and advantages, may be better understood from the following detailed description when read in conjunction with the drawing in which.

Only for the sake of clarity, the drawing is not to any scale. Elements of FIG. 2 that are similar to those of FIG. 1 are denoted by the same reference numerals.

DETAILED DESCRIPTION

Figure 1:
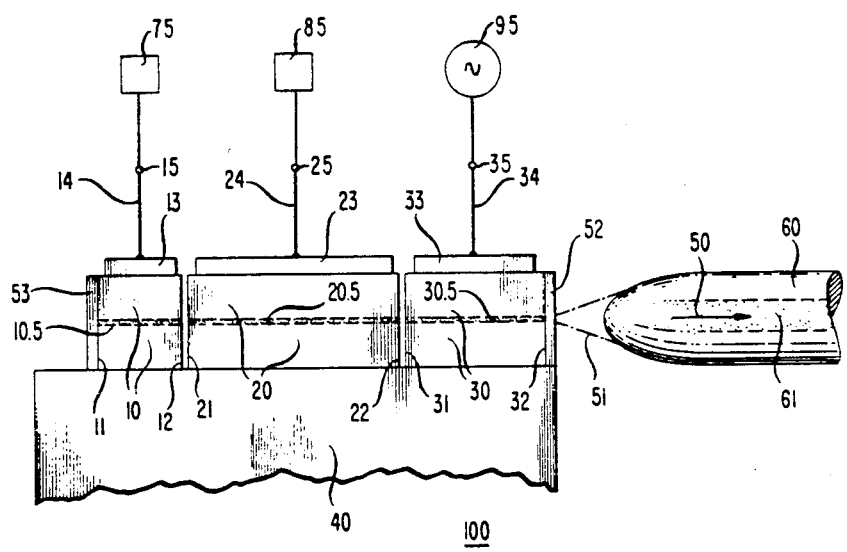
FIG. 1 illustrates a side view of a semiconductor laser structure in accordance with a specific embodiment of the invention.

As shown in FIG. 1, a coupled laser structure 100 comprises first, second, and third semiconductor heterostructure sections 10, 20, and 30, respectively, to produce an output optical wave 50 in an optical fiber guide 60. The laser sections 10, 20, and 30 are located upon a heat sink 40 for mechanical support, a common electrical ground, as well as for thermal cooling purposes. These sections 10, 20, and 30 can take the form of any refractive index guided semiconductor junction laser structure—such as either a planar mesa buried heterojunction structure or a buried crescent heterostructure, as described, for example, by R. A. Logan et al in *Electronics Letters*, Vol. 18, pages 95-96 (1982). In any case, the sections 10, 20, and 30 have mutually aligned waveguide regions 10.5, 20.5, and 30.5, respectively, along which an optical mode—typically of wavelength in the 1.0 to 1.6 micron range—can be supported by the three sections and can be emitted in a diffraction determined pattern 51 to form the output wave 50 in a core region 61 of the optical fiber 60.

The first, second, and third sections advantageously are all derived from a monolithic semiconductor heterojunction waveguide structure which has been cleaved at two locations to provide the two spaces, to wit, the space between the first and second section and the space between the second and third sections. A right-hand facet 12 of the first section 10 is optically coupled to and closely spaced from the left-hand facet 21 of the second section 20 by a predetermined distance advantageously equal to or less than about 4 microns, and preferably less than about 2 microns, but in any case greater than about 0.1 or 0.2 microns (i.e., greater than about 0.1 wavelengths) to provide desired reflectivity between the first and second sections 10 and 20. A left-hand facet 11 of the first section 10 is (optionally) coated with a substantially fully reflecting coating 53 to furnish enhanced reflection; that is, the coating 53 reflects typically at least about 40 percent of incident optical intensity, the Fresnel reflectivity of the facet 11 itself being typically about 35 percent. Similarly, a right-hand facet 22 of the second section 20 is located closely spaced from (typically by a distance of separation of about 2 micron or less, but greater than about 0.1 or 0.2 micron) and in a relatively good optical coupling relation to a left-hand facet 31 of the third section 30. A right-hand facet 32 of the third section 30 is coated with a substantially lossless anti-reflection coating 52, that is, a dielectric coating 52 which reflects less than about 1/10 percent of incident optical beam intensity. The optical fiber 60 is directly optically coupled to the anti-reflection coated facet 32, in order to propagate the wave 50 to a remote receiver (not shown) as known in the art. For example, the end of the fiber guide 60 proximate to the anti-reflection coated facet 32 can take the form of a suitable lens, in order to collect the energy of the optical beam emitted from the right-hand facet 32 of third section 30 and to focus this beam into the core region 61 of the fiber guide. Alternatively, the fiber 60 can directly physically contact the anti-reflection coating 52.

It should be noted that somewhat larger diffraction loss and smaller amounts of coupling can be tolerated between the first and second sections 10 and 20 than between the second and third sections 20 and 30. Accordingly, the desired upper limit of distance of separation between the second and third sections 20 and 30 is ordinarily somewhat smaller than the desired upper limit of the distance of separation between the first and second sections 10 and 20. In any event, in order to afford some desirable reflectivity between the first and second sections and between the second and third sections, distances of separation equal to an integral number of half-wavelengths are not desirable.

On a top surface of each of the sections 10, 20, and 30 is located, preferably in ohmic contact respectively therewith, a separate first, second, and third electrode 13, 23, and 33, respectively. Each of these electrodes 13, 23, and 33 has a separate electrically conductive first, second, and third connection 14, 24, and 34, respectively, to a separate first, second, and third terminal 15, 25, and 35, respectively, for application thereto by electrical sources 75, 85, and 95, respectively, of suitable electrical currents or voltages during operation. More specifically, the electrical source 95 supplies voltage that is modulated in accordance with the signal which is to be transmitted; and the electrical sources 75 and 85 supply dc currents, as more fully described below.

During operation, steady forward dc bias currents are supplied by dc voltage sources 75 and 85 to the first and second terminals 15 and 25, respectively. By "relatively steady" is meant constant within limits that are sufficiently narrow to induce stable single-mode CW laser action in the thus optically coupled first and second sections 10 and 20 in response to dc voltages from sources 75 and 85, one above lasing threshold and the other below threshold for lasing in the corresponding section. The laser action is (optionally) aided by the enhanced optical reflection supplied by the reflection coating 53 at the left-hand facet 11. At the same time, the modulated voltage is supplied to the third terminal 35. This voltage is modulated as a function of time in accordance with the desired optical signal to be transmitted by the output beam 50. Thus when it is desired to transmit a LOW or "0" signal on the output beam, the voltage applied to the third terminal 35 is then made sufficient in magnitude in the reverse bias junction direction of the heterostructure 30 to produce sufficient optical loss therein to reduce the intensity of the output beam 50 to a level equal to or below the desired LOW or "0" level, typically about 10 percent of the optical power level of the HIGH or "1" level; but when it is desired to transmit a HIGH or "1" signal as the output beam, the voltage applied to the third terminal 35 is then made of sufficient magnitude in the forward bias direction (or insufficient magnitude in the reverse bias direction) to increase the intensity of the output wave 50 to a level equal to the desired HIGH or "1" level. Thus, the output wave 50 as a function of time represents—in the same single laser mode, over a relatively long interval of time—the sequence of signals applied to the third terminal 35.

It should be understood that no further external or internal optical cavity forming means (mirror surfaces and the like) is needed or preferred in the structure 100 for the purpose of the invention.

It should also be understood that conventional feedback circuitry, to control the instantaneous magnitudes of the thus relatively steady dc bias currents supplied to the terminals 15 and 25, may be desirable for maintaining stability of the CW output in the presence of temperature drift, aging phenomena, and other disturbances.

Figure 2:
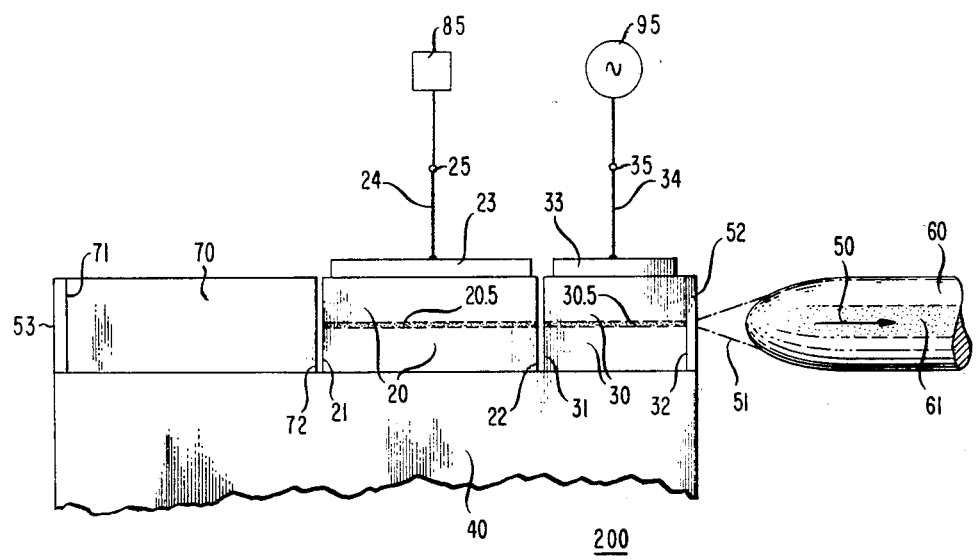
FIG. 2 illustrates a side view of a semiconductor laser structure in accordance with another specific embodiment of the invention.

As shown in FIG. 2, the first section 10 can be replaced with an optical fiber 70 whose right-hand end 72 is optically coupled to the left-hand end 21 of the second section 20 and whose left-hand end 71 is coated with the optically reflecting layer 53. Advantageously, the fiber has a graded index of refraction such that optical radiation entering the right-hand end 72 from the second section 20 is focused on the reflecting layer 71. Alternatively, the fiber 70 can have uniform refractive index, with a right-hand end in the form of a converging lens, similar to the left-hand end of the fiber 60. Illustratively, the right-hand end 72 of the fiber 70 is spaced a distance of about 10 to 20 micron from the left-hand end 21 of the second section 20, whereas the length of the fiber measured from its left-hand end 71 to its right-hand end 72 is about 700 micron or more. In this way, as discussed more fully below, single-mode operation of the second section 20 is favored by reason of transit time delays undergone by the lasing mode and by potential competing modes traveling back and forth in the fiber 70, a region of no optical gain.

The fiber 70 has a length L. This fiber has a round trip optical transit time $t_0 = 2L/v$, where v is the velocity of optical radiation in the fiber. For glass fiber, v is thus approximately equal to 0.75 C, where C is the speed of light in the vacuum. There are two other times of relevance: one is the energy-level cross-relaxation time for free charge carriers in the optically active region of the laser diode, the other is the spatial relaxation time, i.e., the time it takes for carriers to diffuse from a null to a peak in the optical standing wave pattern of the lasing mode. The longer of these two times is denoted by $t_2$. By "cross-relaxation" time is meant the average time it takes a free carrier quantum state to be refilled after emission of a photon. Advantageously, the length L of the fiber is made long enough so that the transit time $t_0$ is approximately equal to, or is greater than, $t_2$. Thus, for a semiconductor characterized by a time $t_2$ of about $7 \times 10^{-12}$ seconds, the length L of the fiber 70 is advantageously about 700 microns or more.

The theory of the expected advantage of such a length L of the fiber 70 is believed to be as follows. The frequency separation between modes, $\Delta f$, is $1/t_0$. Under any circumstance, the minimum time for any significant change in the internal power of any given mode is $t_0$. The turn-off time following instantaneous removal of the injection current is approximately equal to $t_0$ because of the large loss that suddenly appears in the cavity. However the buildup time following applications of injection current will be at least several times $t_0$. A similar comment applies for any fluctuation in the gain. The precise value of the time to change depends on the net instantaneous change in the gain but the minimum value is $t_0$.

If any mode is oscillating strongly and $t_2 < t_0$, then no other potential mode can build up before the free carriers producing gain for that mode will cross-relax to energies contributing to the oscillating mode. In effect when $t_2 < t_0$, the gain profile is sufficiently homogeneous that only a single mode will oscillate. An already oscillating mode is protected against mode competition by the slow buildup time of any other potentially competitive mode. Moreover, one might expect that in the presence of a drift in the gain profile—for example, drift due to a temperature change—a given oscillating mode would continue to oscillate even if the oscillating wavelength is no longer near the peak of the gain profile: drift or fluctuations in the index of refraction might change the output frequency, but the oscillating mode would nevertheless remain the same. The laser cavity with the optical fiber 70 has a free spectral range or mode spacing which is much smaller than that of conventional diode lasers. When the laser is turned on one might expect that a large number of modes near the peak of the gain profile would begin to oscillate. The one with the highest net gain would grow fastest. Cross-relaxation would lead to domination by this one mode, and all other modes would eventually die away. However, such a single frequency laser cannot be internally modulated at high rates. Consequently, an external modulator of the type described herein is desirable. The frequency characteristics of such an externally modulated laser are especially desirable.

In any event, it should be understood that the correctness of the theory is not essential to actual operation.

Although the invention has been described in detail in terms of a specific embodiment, various modifications can be made without departing from the scope of the invention. For example, instead of spaced surfaces which have been cleaved from a unitary heterojunction structure, spaced surfaces which have been etched therefrom may be used.

What is claimed is:

1. A semiconductor laser source comprising
   (a) a first semiconductor heterojunction section for generating single-mode CW optical radiation;
   (b) a second semiconductor heterojunction section, the first and second sections having substantially identical heterojunction cross sections which are mutually optically coupled and closely spaced from each other at the closest approach of an end facet, respectively, of each of the first and second sections;
   (c) means for applying a variable voltage to the second section in order to modulate optical loss in said second section; and
   (d) an optical anti-reflection layer optically coupled to another, opposite end facet of the second section, whereby the optical radiation generated in the first section is modulated by the second section and passes through the anti-reflection layer.

2. A laser source according to claim 1 in which the first and second sections are formed by cleaving a monolithic heterojunction structure.

3. A laser source according to claim 1 in which the first section comprises first and second semiconductor heterojunction subsections, each having a heterojunction structure that is substantially identical to that of the second section, the first and second subsections being mutually optically coupled and closely spaced from each other.

4. A laser source according to claim 3 in which the first and second sections are formed by cleaving a monolithic heterojunction structure.

5. A laser source according to claim 3 in which the first and second sections are formed by cleaving a monolithic structure and in which the first and second subsections are formed by cleaving the first section.

6. A source according to claim 1 further comprising an optical fiber having an end surface optically coupled to the anti-reflection layer.

7. A source according to claim 6 in which the first and second sections are formed by cleaving a monolithic heterojunction structure.

8. A source according to claim 6 further comprising optical reflecting means located at another, opposite end surface of the fiber to reflect optical radiation emanating from such opposite end surface of the fiber back into the fiber.

9. A source according to claim 8 in which the first and second sections are formed by cleaving a monolithic heterojunction structure.

10. A semiconductor laser source comprising:
    (a) a first semiconductor junction diode section;
    (b) a second semiconductor junction diode section having one side facet spaced from, and located in an optical coupling relationship with, a first side facet of the first section;
    (c) a third semiconductor junction diode section having one side facet coated with an optical anti-reflection coating and having another side facet opposite the one side facet thereof spaced from, and located in an optical coupling relationship with, another side facet of the second section opposite the one side facet thereof;
    (d) means for applying a relatively steady forward current bias to the first and second junction diode sections sufficient to produce CW laser action therein; and
    (e) means for applying a variable voltage to the third junction diode section in accordance with a signal, in order to modulate optical loss in the third section, whereby a single-frequency optical beam emanates from the one side facet of the third section with an intensity modulated in accordance with the signal.

11. The source of claim 10 in which the variable voltage is in the reverse bias direction in the third section when the signal goes to its low level.

12. The source of claim 11 in which the first, second, and third sections are formed by cleaving, at two separate locations, a monolithic semiconductor heterojunction structure.

13. An optical transmission system including the source of claim 10 and further comprising an optical fiber directly optically coupled to the one side facet of the third section and in which the first, second, and third sections are formed by cleaving, at two separate locations, a monolithic semiconductor junction structure.

14. The source of claim 10 in which the first and second sections are spaced by about 14 microns or less, and in which the second and third sections are spaced by about 2 microns or less.

15. A semiconductor laser source comprising:
    (a) a first semiconductor junction diode section having a first side facet;
    (b) a second semiconductor junction diode section having one side facet spaced by a distance in the range of 0.1 to about 4 microns from the first side facet of the first section;
    (c) a third semiconductor junction diode section having one side facet coated with an optical anti-reflection coating which reflects less than about 1/10 percent of optical intensity incident thereon and having another side facet opposite the one side facet thereof spaced by a distance in the range of about 0.1 to about 2 microns from another side facet of the second section opposite the one side facet thereof;
    (d) means for applying a relatively steady forward current bias to the first and second junction diode sections sufficient to produce CW single-mode laser action therein; and (e) means for applying a variable voltage to the third junction diode section in accordance with a signal, in order to modulate optical loss in the third section, whereby a single-mode optical beam emanates from the one side facet of the third section with an intensity modulated in accordance with the signal.

16. The source of claim 15 in which a second side facet of the first section opposite to the first side facet is coated with an optical reflection coating which reflects at least about 40 percent of the optional intensity incident thereon.

17. The source of claim 15 in which the variable voltage is in the reverse bias junction direction in the third section when the signal goes to its low level.

18. The source of claim 17 in which a second side facet of the first section opposite to the first side facet is coated with an optical reflection coating which reflects at least about 40 percent of the optional intensity incident thereon.

19. The source of claim 17 in which the first, second, and third sections are formed by cleaving, at two separate locations, a monolithic semiconductor heterojunction structure.

20. The source of claim 19 in which a second side facet of the first section opposite to the first side facet is coated with an optical reflection coating which reflects at least about 40 percent of the optional intensity incident thereon.

21. The source of claim 19 in which the first, second, and third sections are formed by cleaving, at two separate locations, a monolithic semiconductor heterojunction structure.

22. The source of claim 21 in which a second side facet of the first section opposite to the first side facet is coated with an optical reflection coating which reflects at least about 40 percent of the optional intensity incident thereon.

23. An optical system including the source of claim 11 and further comprising an optical fiber directly optically coupled to the one side facet of the third section.

24. The source of claim 23 in which a second side facet of the first section opposite to the first side facet is coated with an optical reflection coating which reflects at least about 40 percent of the optional intensity incident thereon.

25. The source of claim 15 which further comprises an optical fiber directly optically coupled to the one side facet of the third section.

* * * * *

UNITED STATES PATENT AND TRADEMARK OFFICE
CERTIFICATE OF CORRECTION

PATENT NO. : 4,558,449
DATED : December 10, 1985
INVENTOR(S) : Eugene I. Gordon

It is certified that error appears in the above-identified patent and that said Letters Patent is hereby corrected as shown below:

In the Specification, column 6, line 15, "pages 95-96" should read --pages 895-896--.

Signed and Sealed this

Twenty-fifth Day of March 1986

[SEAL]

Attest:

DONALD J. QUIGG

Attesting Officer

Commissioner of Patents and Trademarks